US009443565B2

(12) United States Patent
Jung

(10) Patent No.: US 9,443,565 B2
(45) Date of Patent: Sep. 13, 2016

(54) SEMICONDUCTOR MEMORY DEVICE WITH A DELAY LOCKED LOOP CIRCUIT AND A METHOD FOR CONTROLLING AN OPERATION THEREOF

(71) Applicant: SAMSUNG ELECTRONICS CO., LTD., Suwon-Si, Gyeonggi-Do (KR)

(72) Inventor: Hangi Jung, Hwaseong-si (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 14/219,181

(22) Filed: Mar. 19, 2014

(65) Prior Publication Data

US 2014/0293719 A1 Oct. 2, 2014

Related U.S. Application Data

(60) Provisional application No. 61/806,663, filed on Mar. 29, 2013, provisional application No. 61/806,669, filed on Mar. 29, 2013.

(30) Foreign Application Priority Data

Jun. 26, 2013 (KR) ........................ 10-2013-0073986

(51) Int. Cl.
*G11C 7/02* (2006.01)
*G11C 7/22* (2006.01)
*G11C 11/4072* (2006.01)
*G11C 11/4076* (2006.01)

(52) U.S. Cl.
CPC ................ *G11C 7/02* (2013.01); *G11C 7/222* (2013.01); *G11C 11/4072* (2013.01); *G11C 11/4076* (2013.01); *G11C 2207/2272* (2013.01)

(58) Field of Classification Search
None
See application file for complete search history.

(56) References Cited

U.S. PATENT DOCUMENTS

| 7,002,384 B1 | 2/2006 | Chong et al. |
| 7,355,464 B2 | 4/2008 | Lee |
| 7,404,018 B2 | 7/2008 | Dietrich et al. |
| 7,489,171 B2 | 2/2009 | Song |
| 7,583,119 B2 | 9/2009 | Song |
| 7,751,261 B2 | 7/2010 | Cho |
| 7,773,435 B2 | 8/2010 | Cho |
| 7,952,403 B2 | 5/2011 | Yun |
| 8,030,981 B2 | 10/2011 | Kim |
| 8,045,406 B2 | 10/2011 | Kwon et al. |
| 8,144,531 B2 | 3/2012 | Choi et al. |
| 8,233,339 B2 | 7/2012 | Yoon et al. |
| 8,294,499 B2 | 10/2012 | Kwon et al. |

(Continued)

FOREIGN PATENT DOCUMENTS

| KR | 100259389 | 6/2000 |
| KR | 1020040021479 | 3/2004 |

(Continued)

*Primary Examiner* — Kretelia Graham
(74) *Attorney, Agent, or Firm* — F. Chau & Associates, LLC

(57) ABSTRACT

An operation control method of a semiconductor memory device includes executing a Delay Locked Loop (DLL) locking in response to a DLL reset signal and measuring a loop delay of a DLL. The operation control method further includes storing measured loop delay information and DLL locking information; and performing a delay control of a command path using the stored loop delay information and DLL locking information independent of the DLL, during a latency control operation.

10 Claims, 13 Drawing Sheets

(56) References Cited

U.S. PATENT DOCUMENTS

| | | |
|---|---|---|
| 8,373,471 B2 | 2/2013 | Kim et al. |
| 2008/0061851 A1 | 3/2008 | Jeon |
| 2010/0213991 A1 | 8/2010 | Fukuda |
| 2010/0327926 A1 | 12/2010 | Takahashi |
| 2011/0001525 A1* | 1/2011 | Chung .......... G11C 7/222 327/158 |
| 2011/0204942 A1 | 8/2011 | Abe et al. |
| 2012/0105119 A1 | 5/2012 | Kim et al. |

FOREIGN PATENT DOCUMENTS

| | | |
|---|---|---|
| KR | 1020080035367 | 4/2008 |
| KR | 1020100081035 | 7/2010 |

* cited by examiner

SEMICONDUCTOR MEMORY DEVICE WITH A DELAY LOCKED LOOP CIRCUIT AND A METHOD FOR CONTROLLING AN OPERATION THEREOF

CROSS-REFERENCE TO RELATED APPLICATIONS

This U.S. non-provisional patent application claims priority under 35 U.S.C. §119 to U.S. provisional patent application No. 61/806,663 filed on Mar. 29, 2013, to U.S. provisional patent application No. 61/806,669 filed on Mar. 29, 2013, and to Korean Patent Application No. 10-2013-0073986 filed Jun. 26, 2013, in the Korean Intellectual Property Office, the disclosures of which are incorporated by reference herein in their entireties.

TECHNICAL FIELD

The present inventive concept relates to a semiconductor memory device with a delay locked loop circuit.

DISCUSSION OF RELATED ART in general, a semiconductor memory device utilizes a clock as a reference signal for adjusting operation timing.

When a semiconductor memory device uses an externally applied clock, a time delay (or, a clock skew) arises due to the device's internal circuits. A circuit that adjusts the time delay such that an internal clock has the same phase as that of the externally applied clock is a Delay Locked Loop (DLL) circuit.

Since clock synchronization is required for application of a read latency operation and an On-Die Termination (ODT) technique to a Double Data Rate Synchronous Dynamic Random Access Memory (DDR SDRAM), the DLL circuit is embedded in a synchronous DRAM.

As an operation of a synchronous semiconductor memory device is sped up, a DLL circuit with a robust jitter characteristic is used. In this case, however, the DLL circuit may consume a lot of power.

SUMMARY

An exemplary embodiment of the inventive concept provides an operation control method of a semiconductor memory device, which comprises executing a Delay Locked Loop (DLL) locking in response to a DLL reset signal; measuring a loop delay of a DLL; storing measured loop delay information and DLL locking information; performing a delay control of a command path using the stored loop delay information and DLL locking information independent of the DLL, during a latency control operation.

In exemplary embodiments of the inventive concept, the DLL comprises a clock path, wherein the command path and the clock path are driven independently from each other.

In exemplary embodiments of the inventive concept, the loop delay information is used to determine an additive delay of an additive delay line included in the command path.

In exemplary embodiments of the inventive concept, the DLL locking information is used to determine a DLL delay of a delay line replica that is connected to an output of the additive delay line and wherein the delay line replica has the same delay as that of a delay line of the DLL.

In exemplary embodiments of the inventive concept, a latency value applied through the command path is used to determine the additive delay.

In exemplary embodiments of the inventive concept, the loop delay is measured by counting a feedback clock applied to a phase detector of the DLL within an interval.

In exemplary embodiments of the inventive concept, a number of rising edges of the feedback clock are counted.

An exemplary embodiment of the inventive concept provides an operation control method of a semiconductor memory device, which comprises executing a DLL locking in response to a DLL reset signal; measuring a loop delay of a DLL; storing measured loop delay information and DLL locking information; during an On-Die Termination (ODT) control operation, performing a delay control of a command path using the stored loop delay information and DLL locking information when the DLL is off.

In exemplary embodiments of the inventive concept, the DLL reset signal is applied at a power-up of a semiconductor memory device.

In exemplary embodiments of the inventive concept, the ODT control operation is performed when a latency command is received.

In exemplary embodiments of the inventive concept, the loop delay is measured by counting a result obtained by comparing a feedback clock of the DLL and an input clock of a DLL delay line within an interval.

In exemplary embodiments of the inventive concept, a number of falling edges of the feedback clock are counted.

In exemplary embodiments of the inventive concept, the loop delay information is used to determine an additive delay of an additive delay line included in the command path, together with an ODT control value applied through the command path.

In exemplary embodiments of the inventive concept, the DLL locking information is used to determine a DLL delay of a delay line replica that is connected to an output of the additive delay line and wherein the delay line replica has the same delay as that of a delay line of the DLL.

An exemplary embodiment of the inventive concept provides a semiconductor memory device which comprises a DLL configured to execute a DLL locking at a DLL reset; a DLL control part configured to control the DLL and store DLL locking information at a DLL locking; a loop delay measure circuit configured to measure and store a loop delay of the DLL; and a command path unit including an additive delay line configured to determine an additive delay in response to the loop delay information, and a delay line replica having the same delay as that of a delay line of the DLL and configured to determine a DLL line delay in response to the DLL locking information, wherein during a latency control operation, a delay control of the command path unit is performed using the stored loop delay information and DLL locking information independent of the DLL.

In exemplary embodiments of the inventive concept, the DLL comprises a DLL delay line configured to delay an input clock according to a delay selection signal; a data output buffer replica having the same delay as a delay of a data output buffer and configured to receive an output clock of the DLL delay line; a clock buffer replica having the same delay as a delay of a clock buffer and configured to receive an output buffer clock from the data output buffer replica; and a phase detector configured to generate a phase error detection signal by comparing the input clock with a feedback clock from the clock buffer replica.

In exemplary embodiments of the inventive concept, the DLL control part controls the DLL in response to the phase error detection signal and latches the delay selection signal as the DLL locking information at the DLL locking.

In exemplary embodiments of the inventive concept, the loop delay measure circuit measures the loop delay of the DLL by counting a result obtained by comparing the feedback clock and the input clock within an interval.

In exemplary embodiments of the inventive concept, the loop delay measure circuit comprises a counting circuit configured to count a result obtained by comparing the feedback clock and the input clock within an interval; a decoder configured to decode the count result; and an adder configured to generate the additive delay information using a decoding output value of the decoder and a latency value.

In exemplary embodiments of the inventive concept, the command path unit further comprises a command buffer; and a command decoder connected between the command buffer and the additive delay line.

In exemplary embodiments of the inventive concept, the DLL is powered off during an operation of the command path unit.

In exemplary embodiments of the inventive concept, the command path unit is activated during the latency control operation and the DLL is inactivated during standby and access operation modes of the semiconductor memory device.

In exemplary embodiments of the inventive concept, an update period of the DLL is a value obtained by adding at least two or more clocks to a loop delay measurement value N at a coarse locking operation.

In exemplary embodiments of the inventive concept, an update period of the DLL is a value obtained by adding at least one or more clocks to a loop delay measurement value N at a fine locking operation.

In exemplary embodiments of the inventive concept, the latency control operation is a data read latency control of the semiconductor memory device.

An exemplary embodiment of the inventive concept provides a semiconductor memory device which comprises a DLL configured to execute a DLL locking at a DLL reset; a DLL control part configured to control the DLL and store DLL locking information at a DLL locking; a loop delay measure circuit configured to measure and store a loop delay of the DLL; and a command path unit including an additive delay line configured to determine an additive delay in response to the loop delay information, and a delay line replica having the same delay as that of a delay line of the DLL and configured to determine a DLL line delay in response to the DLL locking information, wherein during an on-die termination control operation, a delay control of the command path unit is performed using the stored loop delay information and DLL locking information when the DLL is off.

In exemplary embodiments of the inventive concept, an update period of the DLL is a value obtained by adding at least two or more clocks to a loop delay measurement value N at a coarse locking operation or a value obtained by adding at least one or more clocks to the loop delay measurement value N at a fine locking operation.

In exemplary embodiments of the inventive concept, the DLL comprises a DLL delay line configured to delay an input clock according to a delay selection signal; a data output buffer replica having the same delay as a delay of a data output buffer and configured to receive an output clock of the DLL delay line; a clock buffer replica having the same delay as a delay of a clock buffer and configured to receive an output buffer clock from the data output buffer replica; and a phase detector configured to generate a phase error detection signal by comparing the input clock with a feedback clock from the clock buffer replica.

In exemplary embodiments of the inventive concept, the loop delay measure circuit comprises a counting circuit configured to count a result obtained by comparing the feedback clock and the input clock within an interval; a decoder configured to decode the count result; and an adder configured to generate the additive delay information using a decoding output value of the decoder and an input extended mode register set (EMRS) value.

An exemplary embodiment of the inventive concept provides a semiconductor memory device which comprises a DLL configured to perform a locking operation; and a command path unit including a first delay unit configured to determine an additive delay in response to loop delay information of the DLL and a second delay unit configured to determine a line delay of the DLL in response to locking information of the DLL, wherein the DLL is powered off during execution of a command using the command path unit.

BRIEF DESCRIPTION OF THE FIGURES

The above and other features of the inventive concept will become more clearly understood by describing in detail exemplary embodiments thereof with reference to the accompanying figures, in which.

DETAILED DESCRIPTION OF THE EMBODIMENTS

Figure 1:
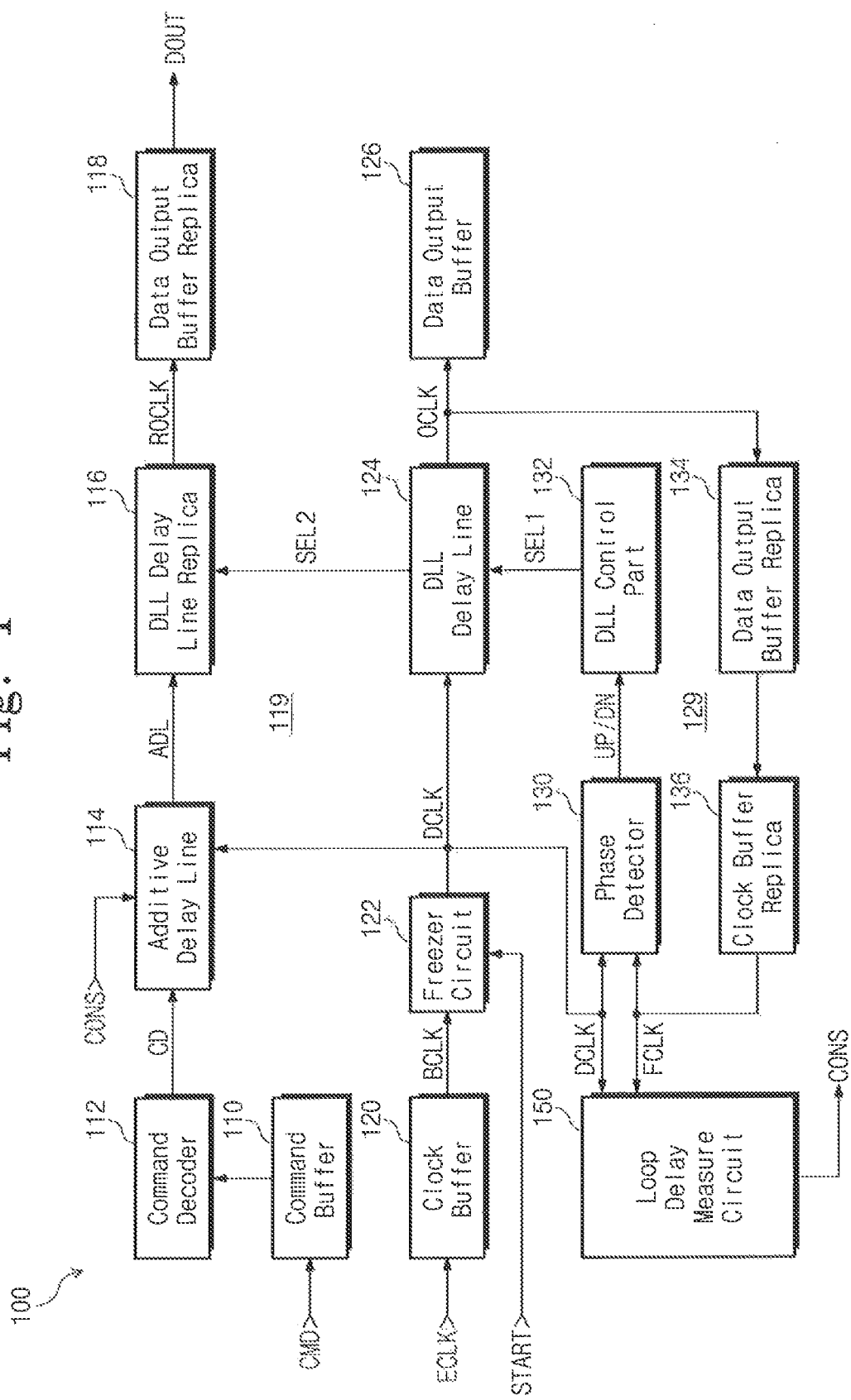
FIG. 1 is a block diagram illustrating a semiconductor memory device including a delay locked loop circuit according to an exemplary embodiment of the inventive concept.

Hereinafter, exemplary embodiments of the inventive concept will be described in detail with reference to the accompanying drawings. The inventive concept, however, may be embodied in various different forms, and should not be construed as being limited only to the illustrated embodiments. Like reference numerals may denote like elements throughout the attached drawings and written description. In the drawings, the sizes and relative sizes of layers and regions may be exaggerated for clarity.

As used herein, the singular forms "a", "an" and "the" are intended to include the plural forms as well, unless the context clearly indicates otherwise.

It will be understood that when an element or layer is referred to as being "on", "connected to", "coupled to", or "adjacent to" another element or layer, it can be directly on, connected, coupled, or adjacent to the other element or layer, or intervening elements or layers may be present.

FIG. 1 is a block diagram illustrating a semiconductor memory device 100 including a delay locked loop circuit according to an exemplary embodiment of the inventive concept.

Referring to FIG. 1, there are illustrated circuit blocks associated with a clock path unit 129 and a command path unit 119 of the semiconductor memory device 100.

The clock path unit 129 includes a delay locked loop circuit (hereinafter, referred to as 'DLL').

At a reset operation of the DLL, the DLL that executes a DLL locking includes a DLL delay line 124 to delay an input clock DCLK according to a delay selection signal SEL1; a data output buffer replica 134 having the same delay as that of a data output buffer 126 and to receive an output clock OCLK of the DLL delay line 124; a clock buffer replica 136 having the same delay as that of a clock buffer 120 and to receive an output buffer clock from the data output buffer replica 134; and a phase detector 130 to generate a phase error detection signal UP/DN by comparing the input clock DCLK with a feedback clock FCLK from the clock buffer replica 136.

The DLL delay line 124 may include a plurality of unit delays. One unit delay is formed of two NAND gates and an inverter, for example. However, the inventive concept is not limited thereto. For example, a unit delay may be implemented by various types of delay devices as well as an inverter delay.

To increase noise immunity, the DLL swings the input clock DCLK by a current mode logic (CML) level. To reduce power consumption, the DLL swings the input clock DCLK by a CML level.

Since a CML circuit for switching to the CML level has a differential circuit structure, its noise immunity is robust. In addition, since a dynamic current component is not generated, it is possible to minimize a noise generated at a peripheral circuit.

A DLL control part 132 is controlled by the DLL and stores DLL locking information at a DLL locking. The DLL control part 132 controls the DLL in response to the phase error detection signal UP/DN and latches the delay selection signal SEL1 as DLL locking information at the DLL locking.

A loop delay measure circuit 150 measures and stores a loop delay of the DLL.

The command path unit 119 includes an additive delay line 114 to decide an additive delay in response to the loop delay information; and a delay line replica 116 having the same delay as that of the delay line 124 of the DLL and to decide a DLL line delay in response to the DLL locking information. The command path unit 119 further comprises a command buffer 110; and a command decoder 112 connected between the command buffer 110 and the additive delay fine 114.

A power to the clock path unit 129 including the DLL is interrupted when the command path unit 119 operates. The command path unit 119 is activated when a latency control operation or an On-Die Termination (ODT) operation is controlled. The DLL is inactivated during standby and access operation modes of the semiconductor memory device 100. Thus, since a command is executed without dependence on the clock path unit 129, power consumption is minimized or reduced by power-off of the DLL.

The latency control operation is a data read latency control operation of the semiconductor memory device 100.

During the ODT control operation or the latency control operation, a delay control of the command path unit 119 is independently performed using the stored loop delay information and DLL locking information. In other words, since replica circuit blocks respectively corresponding to the DLL delay line 124 and the data output buffer 126 included in the clock path unit 129 are implemented within the command path unit 119 (e.g., replicas 116 and 118), the DLL is powered off once a locking operation of the DLL is performed. As a result, in the event that a command for a latency control operation is received under a condition where the DLL is inactivated, output data whose latency is controlled by the command path unit 119 may be provided to the outside of the semiconductor memory device 100.

To perform the above-described operation, the loop delay measure circuit 150 measures a loop delay of the DLL by counting a result obtained through comparison of the feedback clock FCLK and the input clock DLCK within a particular window interval.

Figure 2:
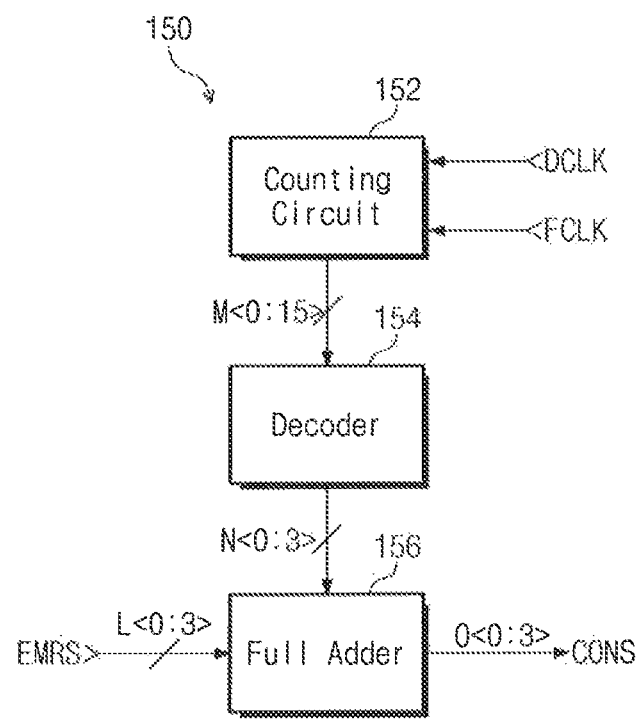
FIG. 2 is a block diagram illustrating a loop delay measure circuit shown in FIG. 1, according to an exemplary embodiment of the inventive concept.

FIG. 2 is a block diagram illustrating the loop delay measure circuit 150 shown in FIG. 1, according to an exemplary embodiment of the inventive concept.

Referring to FIG. 2, the loop delay measure circuit 150 includes a counting circuit 152, a decoder 154, and an adder 156.

The counting circuit 152 counts a result obtained through comparison of a feedback clock FCLK and an input clock DCLK within a particular window interval to output a counting result value M<0:15>.

The decoder 154 decodes the counting result value M<0:15> to generate a decoding output value N<0:3>. The decoding output value N<0:3> may be loop delay information.

The adder 156 is implemented by a full adder and generates additive delay information CONS of bits O<0:3> using the decoding output value N<0:3> of the decoder 154 and a latency value or an ODT value L<0:3> provided through an extended mode register set (EMRS).

For example, an additive delay decided by the additive delay information CONS is (CL−N). Here, 'CL' is a clock latency value and 'N' is a digital code value indicated by the loop delay information. If the clock latency value is 9 and the loop delay value is 3, the additive delay is 6.

Figure 3:
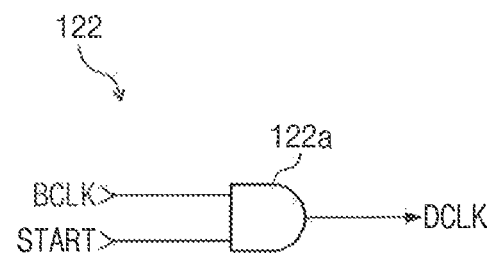
FIG. 3 is a diagram of a freezer circuit shown in FIG. 1, according to an exemplary embodiment of the inventive concept.

FIG. 3 is a diagram of a freezer circuit 122 shown in FIG. 1, according to an exemplary embodiment of the inventive concept.

Referring to FIG. 3, an AND gate 122a performs an AND operation on a buffering clock BCLK provided through the clock buffer 120 and a start signal START. The AND gate 122a outputs an input clock DCLK as the AND operation result. The start signal START may be a signal applied to a memory controller, for example.

Figure 4:
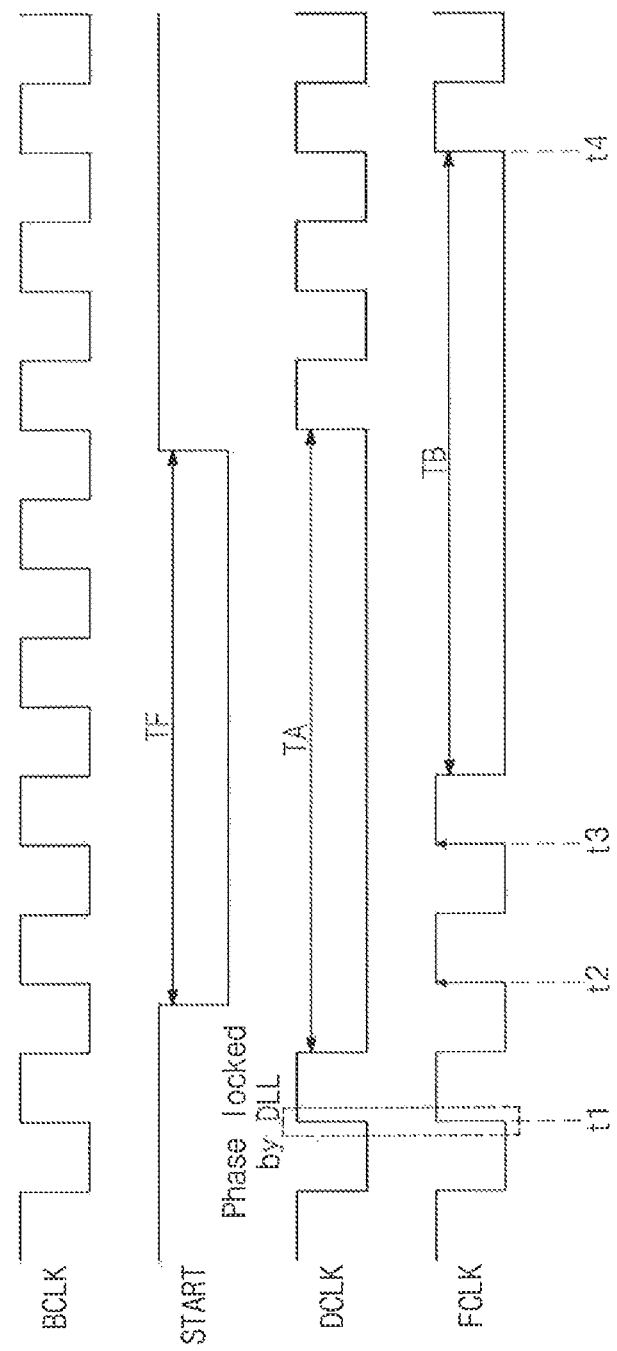
FIG. 4 is an operation timing diagram according to an exemplary embodiment of the inventive concept.

FIG. 4 is an operation timing diagram according to an exemplary embodiment of the inventive concept.

Referring to FIG. 4, waveforms of a buffering clock BCLK, a start signal START, an input clock DCLK, and a feedback clock FCLK are exemplarily shown.

The buffering clock BCLK is a clock signal output from the clock buffer 120 shown in FIG. 1.

The start signal START is a signal applied to the freezer circuit 122 shown in FIG. 1.

The input clock DCLK is an output clock signal output from the freezer circuit 122.

The feedback clock FCLK is a feedback clock signal output from the clock buffer replica 136 shown in FIG. 1.

A loop delay is measured by comparing the input clock DCLK and the feedback clock FCLK.

Assuming that a DLL is locked at t1, the start signal START maintains a low level for a window interval TF.

The counting circuit 152 shown in FIG. 2 counts the number of rising edges of the feedback clock FCLK during the window interval TF. In the case of FIG. 4, the counting circuit 152 counts at t2 and t3, respectively. Thus, a loop delay may correspond to two clocks. If the counting circuit 152 counts three times, a loop delay may correspond to three clocks.

In FIG. 4, there is illustrated an embodiment where the counting circuit 152 counts at a rising edge. However, the inventive concept is not limited thereto. For example, the counting circuit 152 may count at a falling edge.

Further, as shown in FIG. 4, the input clock DCLK does not swing in an interval TA due to a freezing function of the freezer circuit 122 and then swings, at the end of the interval TA. In addition, the feedback clock FCLK does not swing in an interval TB and then swings at t4.

Here, the interval TA is substantially the same as the interval TB.

Figure 5:
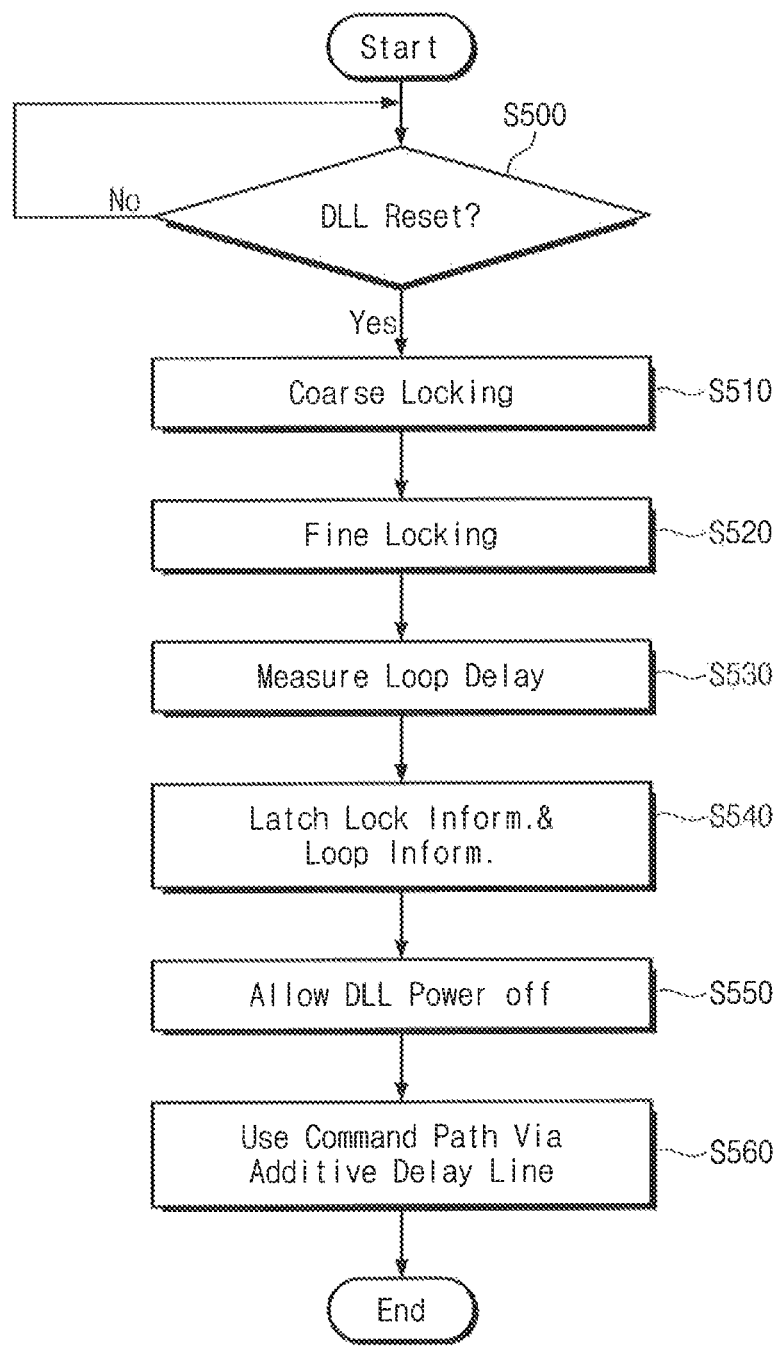
FIG. 5 is an operation flow chart according to an exemplary embodiment of the inventive concept.

FIG. 5 is an operation flow chart according to an exemplary embodiment of the inventive concept.

Below, an operation of the semiconductor memory device 100 of FIG. 1 will be more fully described according to steps shown in FIG. 5.

In step S500, whether a DLL reset command is provided to the semiconductor memory device 100 shown in FIG. 1 is determined. If it is determined that the DLL reset command is provided to the semiconductor memory device 100, the process proceeds to step S510. In step S510, a coarse locking operation of a DLL is executed.

Step S510 is a step where the DLL executes a coarse locking operation. If the coarse locking operation ends, in step S520, a fine locking operation is executed. In the coarse and fine locking steps, an external clock ECLK applied to the clock buffer 120 shown in FIG. 1 is delayed by a delay of the clock buffer 120 and then appears at an output terminal of the clock buffer 120 as a buffering clock BCLK. In this case, since a start signal START has a logic high level, the buffering clock BCLK passes through the freezer circuit 122 and is output as an input clock DCLK. In other words, a phase of the buffering clock BCLK is substantially the same as that of the input clock DCLK.

For DLL locking, the DLL delay line 124 delays the input clock DCLK in response to a delay selection signal SEL1. An output clock OCLK of the DLL delay line 124 is applied to the data output buffer replica 134. The data output buffer replica 134 delays the output clock OCLK by a delay of the data output buffer 126 to generate an output buffer clock. The output buffer clock is applied to the clock buffer replica 136. The clock buffer replica 136 delays the output buffer clock by a delay of the clock buffer 120 to generate a feedback clock FCLK. The feedback clock FCLK is applied to the phase detector 130. The phase detector 130 compares a phase of the input clock DCLK and a phase of the feedback clock FCLK to output a phase error detection signal UP/DN. The phase error detection signal UP/DN functions as a signal for shifting a phase of the input clock DCLK ahead or back to correspond with a phase of the feedback clock FCLK. The DLL control part 132 updates the delay selection signal SEL1 in response to the phase error detection signal UP/DN. At t1 shown FIG. 4, the phases of the input and feedback clocks DCLK and FCLK coincide through use of the above-described DLL locking operation. If the DLL locking operation is completed at t1, the DLL control part 132 latches the delay selection signal SEL1 as DLL locking information. As a result, the DLL locking information is a digital code value that is expressed by a particular bit number.

After the DLL locking is executed, in step S530, an operation of measuring a loop delay is performed.

As illustrated in FIG. 4, the input clock DCLK has a low level in the interval TA due to a clock freezing function of the freezer circuit 122. Further, the feedback clock FCLK is affected by the input clock DCLK and has a waveform as shown in FIG. 4.

The loop delay measure circuit 150 shown in FIG. 1 counts the number of rising edges of the feedback clock FCLK during the window interval TF of FIG. 4. In the case of FIG. 4, since the number of rising edges is 2, a loop delay corresponding to two clocks is measured If measurement of the loop delay ends, in step S540, DLL locking information and loop delay information are latched. In the above-described example, the loop delay measure circuit 150 stores a loop delay value of '2' in an internal latch element.

That the DLL of the semiconductor memory device 100 is powered off after the loop delay is measured does not impact the process. In other words, step S550 is performed to reduce power consumed during a standby operation or a memory access operation (including a read operation and a write operation).

Step S550 is step where DLL power-off is allowed. After the loop delay is measured, the semiconductor memory device 100 interrupts the power to the clock path unit 129 including the DLL through an internal control circuit.

In case of the JEDEC standards, a time for updating a DLL at initialization of a dynamic random access memory (DRAM) is set to 512 clock cycles. In other words, a DLL locking operation has to be completed within 512 clock cycles after power-up.

Steps S510 to S540 are performed during an initialization interval of the DRAM.

In other words, during the initialization interval. DLL locking information and loop delay information are latched. If the initialization interval elapses and a command for a memory access operation is received, a read latency operation or an ODT control operation is carried out using the latched information independently from the DLL, in other words, without dependence on an operation of the DLL.

Afterwards, although a command for a memory operation is received from an external device, the command path unit 119 operates independently without dependence on the clock path unit 129.

Step S560 is step where the command path unit 119 is used at reception of a command.

For example, assuming that a command CMD having a read latency of '6' is applied to the command buffer 110, the command decoder 112 outputs a command decoding signal CD corresponding to the input command. The additive delay line 114 delays the command decoding signal CD by an additive delay to output an additive delay line output signal ADL.

Herein, the size of additive delay is decided according to additive delay information CONS. For example, when a read latency is 9 and a loop delay is 2, the additive delay is 7 (e.g., 9-2). Thus, the additive delay line 114 delays the command decoding signal CD by an interval corresponding to six clocks and outputs the additive delay line output signal ADL. As a result, the size of additive delay is decided according to a loop delay measurement value of the DLL and a latency value required by the external device.

Here, there is described an embodiment where the size of additive delay is added by a 1-clock unit. However, the inventive concept is not limited thereto. For example, the additive delay line 114 is designed such that the size of additive delay can be added by a 0.5-clock unit.

The additive delay line output signal ADL is applied to the DLL delay line 116 that is installed within the command path unit 119. The DLL delay line 116 is a replica of the DLL delay line 124 included in the clock path unit 129. In other words, the DLL delay line 116 generates a replica output clock ROCLK by delaying the additive delay line output signal ADL in response to a delay selection signal SEL2. The delay selection signal SEL2 is DLL locking information and is the same signal as a delay selection signal SEL1 stored during a DLL locking operation. Thus, the replica output clock ROCLK is a clock signal phase locked with an external clock signal ECLK and is a signal to which the read latency of '0' is reflected.

The data output buffer replica 118 outputs read data DOUT to the external device in response to the replica output clock ROCLK. Here, the replica output clock ROCLK functions as a data output enable signal EN.

Thus, the read data DOUT is output in synchronization with the external clock ECLK after a time corresponding to the read latency of '9'.

As described above, the read data DOUT is output to the external device in response to the replica output clock ROCLK generated from the command path unit 119, without dependence on the clock path unit 129. If the DLL of the clock path unit 129 is powered off during a standby operation or a memory access operation, power consumption of the semiconductor memory device 100 is minimized or reduced.

A latency of a conventional DRAM is controlled based on a locking clock of the DLL. In other words, the DLL maintains an active state such that a command (e.g., a command corresponding to a data read operation or an ODT operation) necessitating a latency is executed. In the case of, for example, Double Data Rate (DDR) 1333, a current of about 3 mA is consumed at a DLL operation. In embodiments of the inventive concept, since the DLL is powered off during a latency operation, power is not consumed during a DLL operation.

Further, an ODT technique is used to improve signal integrity by minimizing signal reflection caused at an interface between a Stub Series Termination Logic (SSTL) based system and a memory. Conventionally, a termination voltage VTT is supplied from a motherboard. In the case of a Synchronous Dynamic Random Access Memory (SDRAM) having DDR2 or higher versions, a DRAM and a memory controller may provide the termination voltage by using the ODT technique.

In accordance with an operation of FIG. 1, that the DLL is powered off does not impact the process when ODT latency is controlled. Like the above description, the ODT is controlled by the replica output clock ROCLK generated from the command path unit 119, without dependence on the clock path unit 129. As a result, the DLL of the clock path unit 129 is powered off during a standby operation or a memory access operation, and the ODT is controlled through the command path unit 119.

Below, there is described an embodiment where an update period of the DLL is optimally decided.

DLL locking may compensate for an asynchronous delay of a clock path. A period of a DLL update is decided to be longer than a delay of the clock path for accurate compensation of the asynchronous delay. In other words, an update cycle is set to be longer than a delay of the clock path to secure a noise immunity characteristic.

Further, since 'tDLLinit' is defined as 512*tCC in the JEDEC standards, a DLL locking operation is terminated within 512 clock cycles. Thus, a trade-off exists between a bang-bang jitter characteristic and a locking time. In other words, a long update period is required to reduce a bang-bang jitter, while a short update period is required to cope with power noise quickly.

In exemplary embodiments of the inventive concept, an optimal update period is decided after measurement of a loop delay of the clock path. The decided update period is larger than the measured loop delay and is decided to have a value capable of securing the fastest update operation.

Since an update period is decided to have an optimal value regardless of a variation in an operation frequency or voltage, an update period deciding method according to an exemplary embodiment of the inventive concept is robust to the bang-bang jitter and is effective to reduce a locking time.

Figure 6:
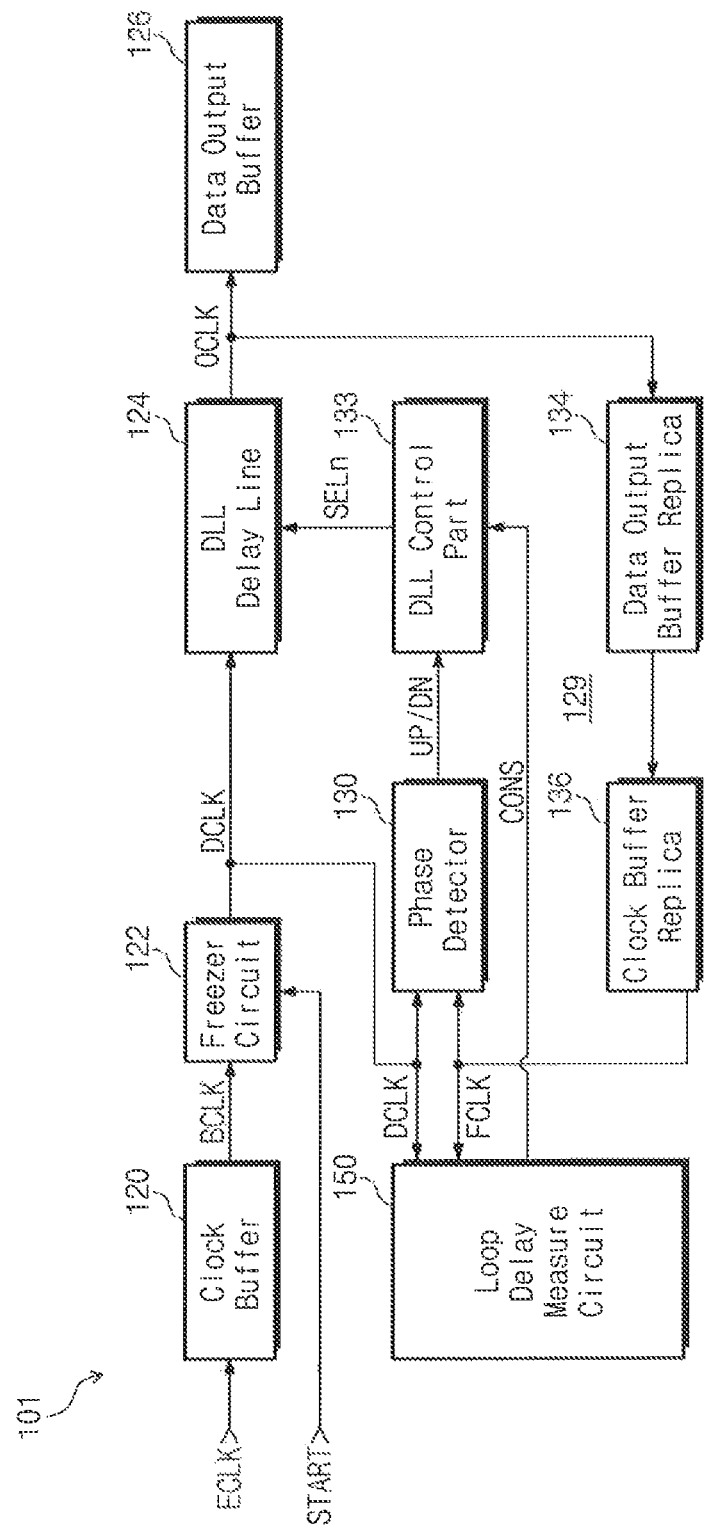
FIG. 6 is a block diagram illustrating a semiconductor memory device including a delay locked loop circuit according to an exemplary embodiment of the inventive concept.

FIG. 6 is a block diagram illustrating a semiconductor memory device 101 including a delay locked loop circuit according to an exemplary embodiment of the inventive concept.

Referring to FIG. 6, there are shown circuit blocks associated with a clock path unit 129 of the semiconductor memory device 101.

The clock path unit 129 includes a DLL.

The DLL executing a DLL locking includes a DLL delay line 124 to delay an input clock DCLK according to a delay selection signal SELn; a data output buffer replica 134 having the same delay as that of a data output buffer 126 and to receive an output clock OCLK of the DLL delay line 124; a clock buffer replica 136 having the same delay as that of a clock buffer 120 and to receive an output buffer clock from the data output buffer replica 134; and a phase detector 130 to generate a phase error detection signal UP/DN by comparing the input clock DCLK with a feedback clock FCLK from the clock buffer replica 136.

The DLL delay line 124 includes a plurality of unit delays. One unit delay is formed of two NAND gates and an inverter, for example. However, the inventive concept is not limited thereto. For example, a unit delay may be implemented by various types of delay devices as well as an inverter delay.

To increase noise immunity, the DLL swings the input clock DCLK by a CML level. To reduce power consumption, the DLL swings the input clock DCLK by a CML level.

A DLL control part 133 is controlled by the DLL and stores DLL locking information at a DLL locking. The DLL control part 133 controls the DLL in response to the phase error detection signal UP/DN and latches the delay selection signal SELn as DLL locking information at the DLL locking.

A loop delay measure circuit 150 measures and stores a loop delay of the DLL. The loop delay measure circuit 150 generates an update period control signal CONS using the measured loop delay information. The update period control signal CONS is applied to the DLL control part 133.

To decide the update period control signal CONS, the loop delay measure circuit 150 counts a result obtained by comparing the feedback clock FCLK and the input clock DCLK within a particular window interval and measures a loop delay of the DLL.

The loop delay measure circuit 150 measures a loop delay using the counting circuit 152 shown in FIG. 2. The counting circuit 152 outputs a counting result value M<0:15> by comparing the feedback clock FCLK and the input clock DCLK within a particular window interval.

The loop delay measure circuit 150 measures a loop delay as described with reference to FIG. 4.

Returning to FIG. 4, assuming that the DLL is locked at t1, the start signal START maintains the low level for the window interval TF and the counting circuit 152 counts the number of rising edges of the feedback clock FCLK during the window interval TF. In the case of FIG. 4, a loop delay measured may correspond to two clocks.

After measuring the loop delay, the loop delay measure circuit 150 adds a delay corresponding to one clock period or two clock periods to the loop delay measured to finally decide the update period control signal CONS. In other words, assuming that the size of the loop delay is N, the update period is (N+1) or (N+2). If the loop delay is decided as described above, a bang-bang jitter is minimized and the fastest update operation is secured.

Figure 7:
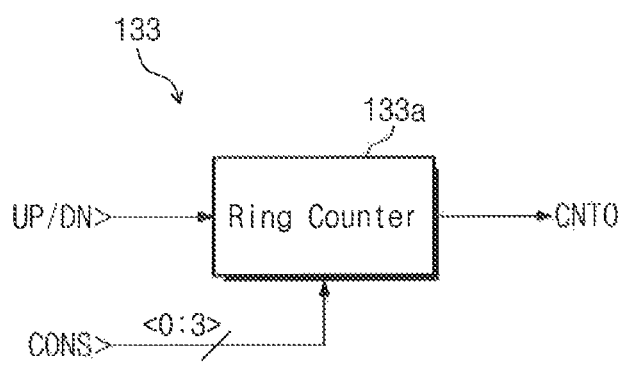
FIG. 7 is a diagram illustrating a delay locked loop circuit control part according to an exemplary embodiment of the inventive concept.

The loop delay measure circuit 150 provides the update period control signal CONS to a ring counter configured as illustrated in FIG. 7.

FIG. 7 is a diagram illustrating the DLL control part 133 according to an exemplary embodiment of the inventive concept.

A ring counter 133a shown in FIG. 7 is a circuit block included in the DLL control part 133. The ring counter 133a performs a counting operation in response to a phase error detection signal UP/DN and an update period control signal CONS. The update period control signal CONS is used to decide a counting operation frequency of the ring counter 133a. The DLL update control part 133 updates a DLL locking in response to a counting output CNTO of the ring counter 133a.

In FIG. 6, there is described an embodiment where the loop delay measure circuit 150 decides the update period control signal CONS. However, the loop delay measure circuit 150 only provides loop delay information to the DLL control part 133, and the DLL control part 133 finally decides an update period of the DLL.

Figure 8:
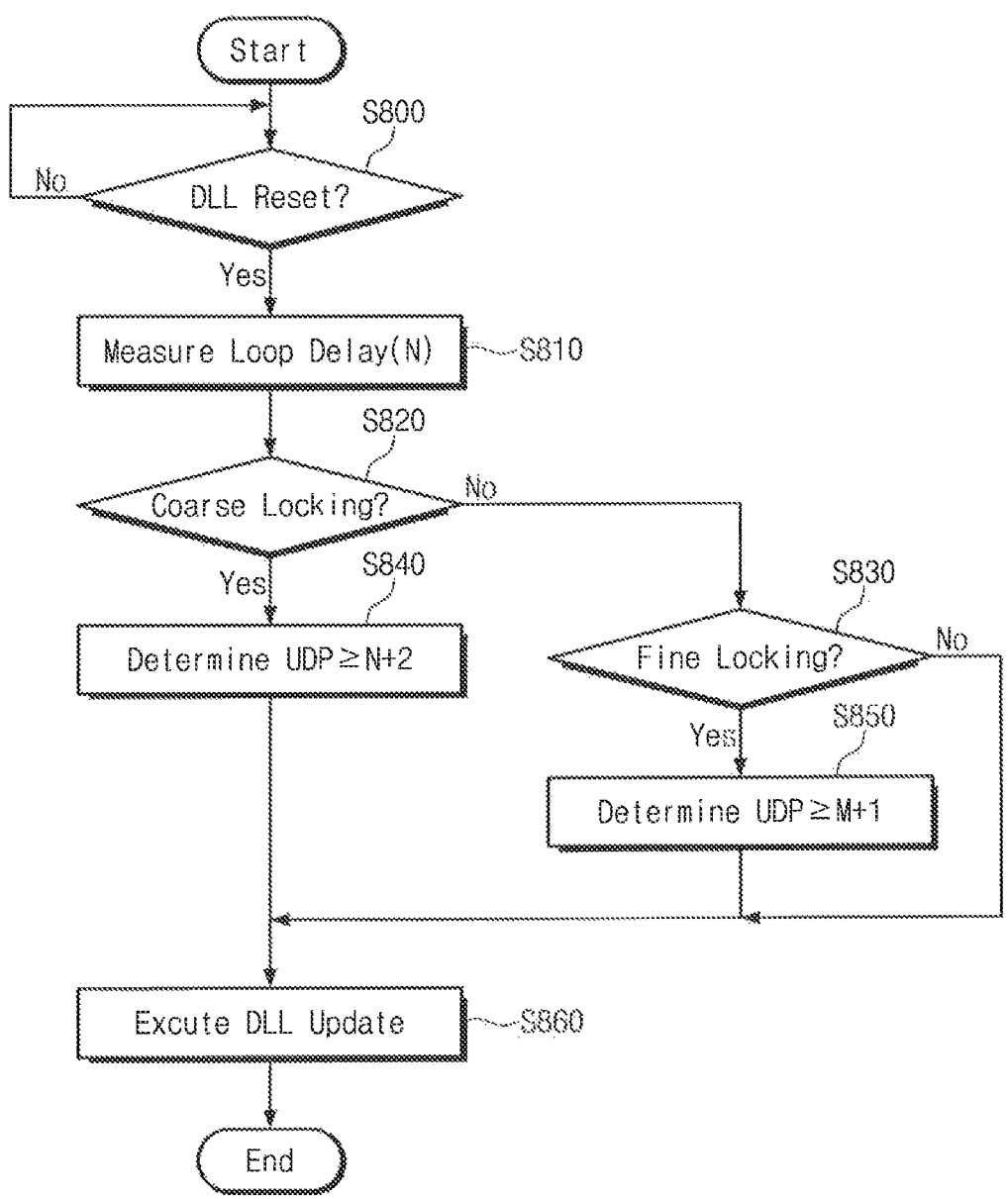
FIG. 8 is an operation flow chart associated with FIG. 6 according to an exemplary embodiment of the inventive concept.

FIG. 8 is an operation flow chart associated with FIG. 6, according to an exemplary embodiment of the inventive concept.

Below, an operation of FIG. 6 is described according to steps shown in FIG. 8.

In step S800, whether a DLL reset command is applied to the semiconductor memory device 101 shown in FIG. 6 is determined. If the DLL reset command is applied, the process proceeds to step S810 where a loop delay of the DLL is measured.

In step S810, the loop delay measure circuit 150 illustrated in FIG. 6 measures a loop delay. The input clock DCLK has a low level during the interval TA (refer to FIG. 4) due to a clock freezing function of a freezer circuit 122 shown in FIG. 6. Further, the feedback clock FCLK is affected by the input clock DCLK, so that it has a waveform shown in FIG. 4. The loop delay measure circuit 150 illustrated in FIG. 6 counts the number of rising edges of the feedback clock FCLK during the window interval TF shown in FIG. 4. In the case of FIG. 4, since the number of rising edges is 2, a loop delay corresponding to two clocks is measured Step S820 is passed when the DLL executes a coarse locking operation. In the event that the DLL executes the coarse locking operation, in step S840, an update period UDP is decided as a value more than (N+2). Here, 'N' is a value of the measured loop delay.

Meanwhile, step S830 is passed when the DLL executes a fine locking operation. In the event that the DLL executes the fine locking operation, in step S850, the update period UDP is decided as a value more than (M+1). Here, 'M' is a value of the measured loop delay.

If an update period is decided during the coarse locking operation or the fine locking operation, a DLL update operation is accomplished through execution of step S860.

As described above, although an operation frequency or voltage is changed, an update period is set to an optimal value through an update period deciding method of FIG. 6. Thus, the update period deciding method is robust to a bang-bang jitter and is effective to reduce a locking time.

Figure 9:
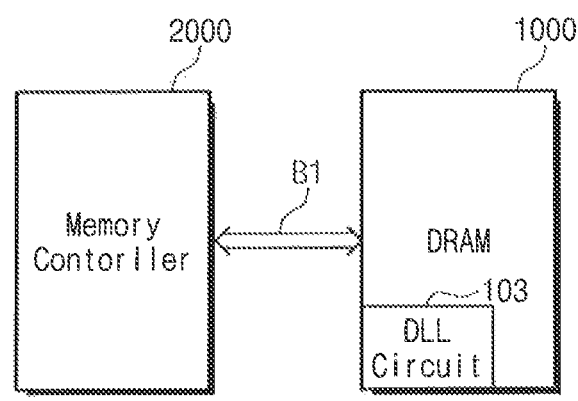
FIG. 9 is a block diagram illustrating a memory system including a semiconductor memory device like that shown in FIG. 1 according to an exemplary embodiment of the inventive concept.

FIG. 9 is a block diagram illustrating a memory system including a semiconductor memory device like that shown in FIG. 1 according to an exemplary embodiment of the inventive concept.

Referring to FIG. 9, a memory system may include a memory controller 2000 and a DRAM 1000. The DRAM 1000 is connected to the memory controller 2000 through a system bus B1 to receive data, an address, and a command. The DRAM 1000 provides the memory controller 2000 with data read from memory cells through the system bus B1.

The memory controller 2000 is connected to a host (not shown) through a particular interface.

The DRAM 1000 includes a delay locked loop (DLL) circuit 103 having a circuit configuration like the delay locked loop circuit shown in FIG. 1.

In the memory system, the DRAM 1000 may include a clock path unit having a delay locked loop circuit and a command path unit operating independently from the clock path unit. Therefore, the delay locked loop circuit is powered off during a standby operation or an access operation. Thus, power consumption of the memory system is minimized or reduced. In addition, a jitter-robust and fast update operation is executed by deciding an optimal update period of the delay locked loop circuit. Thus, the reliability of the memory system including the DRAM 1000 is increased and power consumption is reduced.

Figure 10:
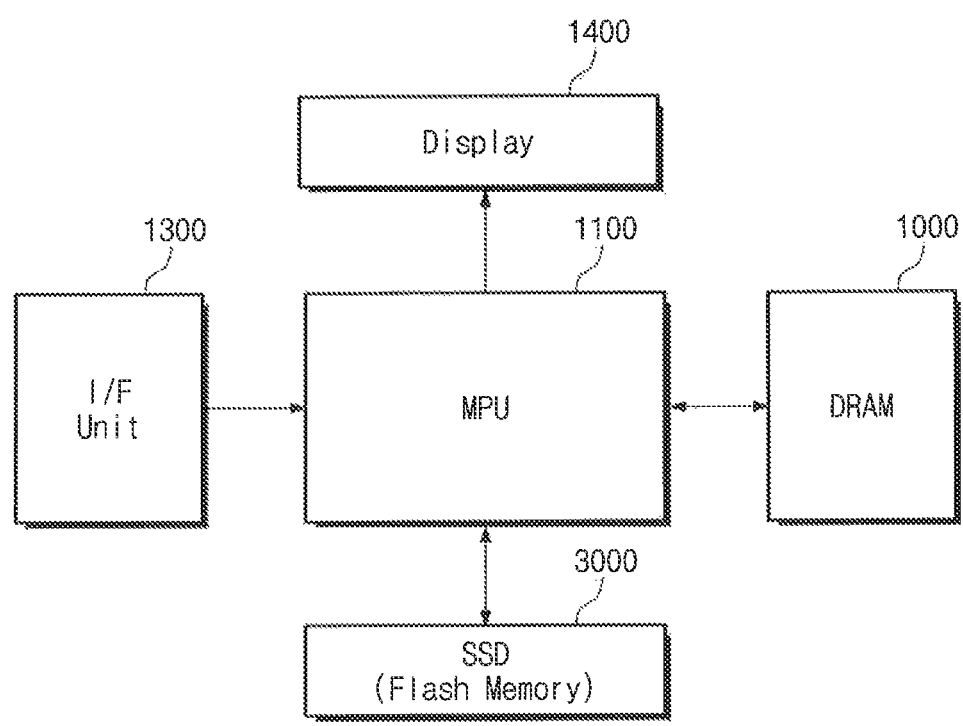
FIG. 10 is a block diagram illustrating an exemplary embodiment of the inventive concept applied to a mobile device.

FIG. 10 is a block diagram illustrating an exemplary embodiment of the inventive concept applied to a mobile device.

Referring to FIG. 10, the mobile device may be a notebook computer or a handheld electronic device, and includes a DRAM 1000, a micro processing unit (MPU) 1100, an interface unit 1300, a display 1400, and a solid state drive (SSD) 3000.

In some cases, the DRAM 1000, the MPU 1100, and the SSD 3000 are provided in the form of a package or integrated to a chip. This may mean that the DRAM 1000 and the SSD (e.g., flash memory) 3000 are embedded in the mobile device.

If the mobile device is a portable communications device, the interface unit 1300 is connected to a modem and transceiver block which is configured to perform a communication data transmitting and receiving function and a data modulating and demodulating function.

The MPU 1100 controls an overall operation of the mobile device according to a given program.

The DRAM 1000 is connected to the MPU 1100, and functions as a buffer memory or a main memory of the MPU 1100. The DRAM 1000 includes a clock path unit having a delay locked loop circuit like that shown in FIG. 1 and a command path unit operating independently from the clock path unit. Therefore, the delay locked loop circuit is powered off during a standby operation or an access operation. Thus, power consumption of the DRAM 1000 is minimized or reduced. In addition, a jitter-robust and fast update operation is executed by deciding an optimal update period of the delay locked loop circuit. Thus, the reliability of the mobile device including the DRAM 1000 is increased and power consumption is reduced.

The SSD 3000 includes a NOR or NAND flash memory.

The display 1400 has a liquid crystal having a backlight, a liquid crystal having a light emitting diode (LED) light source, or a touch screen (e.g., organic light emitting diode (OLED)). The display 1400 is used as an output device for displaying images (e.g., characters, numbers, pictures, etc.) in color.

The present embodiment of the inventive concept is described under assumption that the mobile device is a mobile communications device. In some cases, the mobile device may function as a smart card by adding or removing components to or from the mobile device.

In the case of the mobile device, a separate interface is connected to an external communications device. The external communications device is a DVD player, a computer, a set top box (STB), a game machine, a digital camcorder, or the like.

Although not shown in FIG. 10, the mobile device may further include an application chipset, a camera image processor (CIS), a mobile DRAM, etc.

Chips forming the mobile device may be packed using various packages such as Package on Package (PoP), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline Integrated Circuit (SOIC), Shrink Small Outline Package (SSOP), Thin Small Outline Package (TSOP), System In Package (SIP), Multi Chip Package (MCP), Wafer-level Fabricated Package (WFP), Wafer-Level Processed Stack Package (WSP), etc.

In FIG. 10, there is illustrated an example in which a flash memory is used. However, a variety of nonvolatile storages may be used.

The nonvolatile storage may store data information having various data formats such as text, graphics, software code, etc.

The nonvolatile storage may be formed of Electrically Erasable Programmable Read-Only Memory (EEPROM), flash memory, Magnetic RAM (MRAM), Spin-Transfer Torque MRAM (STT-MRAM), Conductive bridging RAM (CBRAM), Ferroelectric RAM (FeRAM), Phase change RAM (PRAM) such as Ovonic Unified Memory (OUM), Resistive RAM (RRAM or ReRAM), nanotube RRAM, Polymer RAM (PoRAM), Nano Floating Gate Memory (NFGM), holographic memory, a molecular electronics memory device, or insulator resistance change memory.

Figure 11:
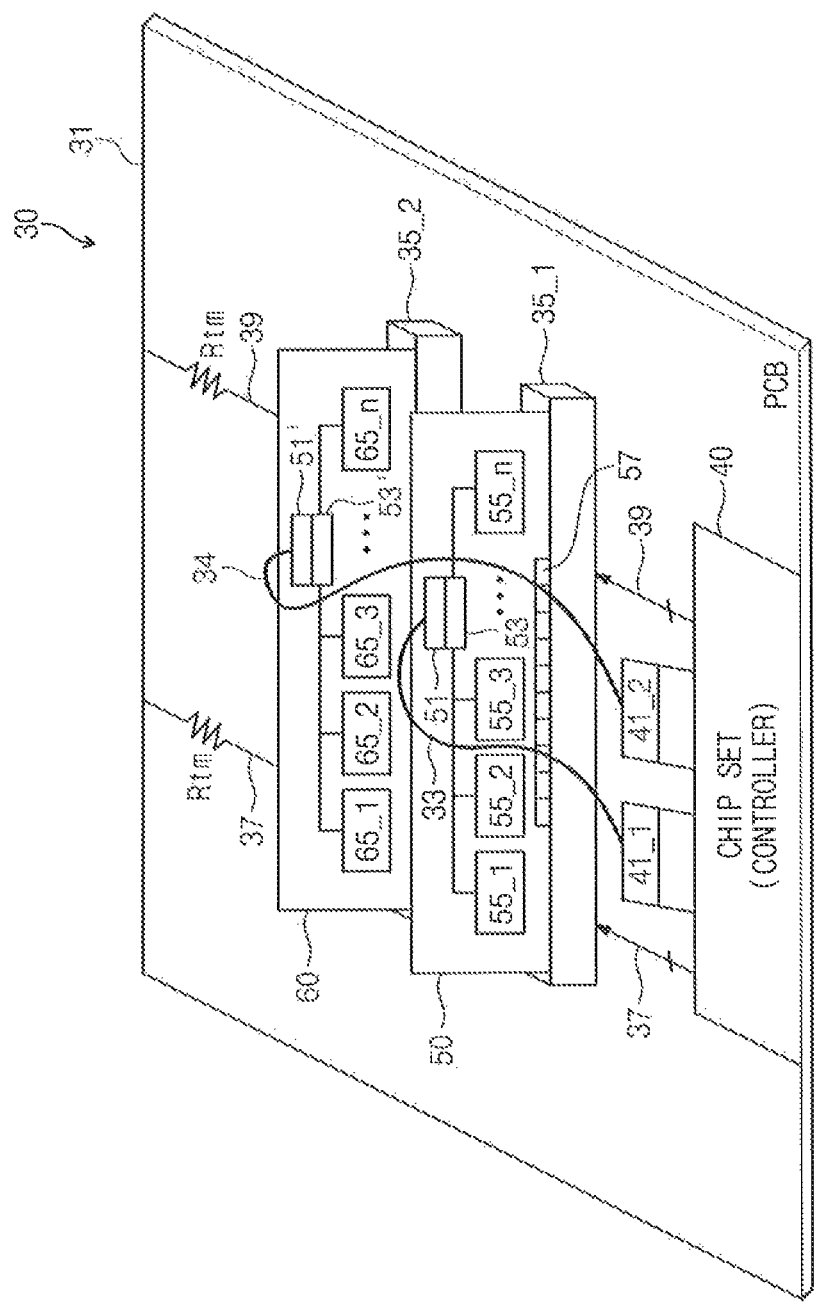
FIG. 11 is a block diagram illustrating an exemplary embodiment of the inventive concept applied to an optical input/output (I/O) scheme.

FIG. 11 is a block diagram illustrating an exemplary embodiment of the inventive concept applied to an optical input/output (I/O) scheme.

Referring to FIG. 11, a memory system 30 adopting a high-speed optical I/O scheme includes a chipset 40 as a controller and memory modules 50 and 60 mounted on a printed circuit board (PCB) substrate 31. The memory modules 50 and 60 are inserted in slots 35_1 and 35_2 installed on the PCB substrate 31. The memory module 50 includes a connector 57, DRAM memory chips 55_1 to 55_n, an optical I/O input unit 51, and an optical I/O output unit 53. The memory module 60 includes DRAM memory chips 65_1 to 65_n, an optical I/O input unit 51', and an optical I/O output unit 53'.

The optical I/O input unit 51/51' includes a photoelectric conversion element (e.g., a photodiode) to convert an input optical signal into an electrical signal. The electrical signal output from the photoelectric conversion element is received by the memory module 50/60. The optical I/O output unit 53/53' includes an electro-photic conversion element (e.g., a laser diode) to convert an electrical signal output from the memory module 50/60 into an optical signal. In some cases, the optical I/O output unit 53/53' further includes an optical modulator to modulate a signal output from a light source.

An optical cable 33/34 performs a role of optical communications between the optical I/O input unit 51/51' of the memory module 50/50 and an optical transmission unit 41_1/41_2 of the chipset 40. The optical communications may have a bandwidth (e.g., more than 20 gigabits per second). The memory module 50 receives signals or data from signal lines 37 and 39 of the chipset 40 through the connector 57, and performs high-speed data communications with the chipset 40 through the optical cable 33. Further, resistors Rtm installed at lines 37 and 39 are termination resistors.

The DRAM memory chips 55_1 to 55_n and 65_11 to 65_n according to an exemplary embodiment of the inventive concept may be applied to the memory system 30 with the optical I/O structure of FIG. 11.

In the memory system 30, each of the DRAM memory chips 55_1 to 55_n and 65_1 to 65_n includes a clock path unit having a delay locked loop circuit like that shown in FIG. 1 or FIG. 6 and a command path unit operating independently from the clock path unit. Therefore, the delay locked loop circuit is powered off during a standby operation or an access operation. Thus, power consumption of the memory system 30 is minimized or reduced. In addition, a jitter-robust and fast update operation is executed by deciding an optimal update period of the delay locked loop circuit. Thus, the performance of the mobile device 30 including the DRAM memory chips 55_1 to 55_n and 65_1 to 65_n is increased.

In FIG. 11 the chipset 40 includes a concentration access detecting unit. The concentration access detecting unit may generate a concentration access detection signal when an input frequency of a frequently applied address exceeds a threshold value.

When the concentration access detection signal is generated, the chipset 40 prevents or alleviates corruption of data of memory cells adjacent to a specific memory area.

For example, if a specific word line, bit line or memory block of a volatile semiconductor memory (e.g., DRAM) is intensively accessed, corruption of cell data may be caused. In other words, cell data of memory cells of word lines adjacent to a specific word line, bit lines adjacent to a specific bit line, or a memory block adjacent to a specific memory block are lost due to concentrated access.

In the case that the DRAM memory chips 55_1 to 55_n and 65_1 to 65_n of the memory modules 50 and 60 are accessed by a memory page unit, a column unit or a bank unit, the concentration access detecting unit may monitor access concentration.

In the case that the memory system 30 of FIG. 11 is an SSD, the DRAM memory chips 55_1 to 55_n and 65_1 to 65_n may be used as a user data buffer.

Figure 12:
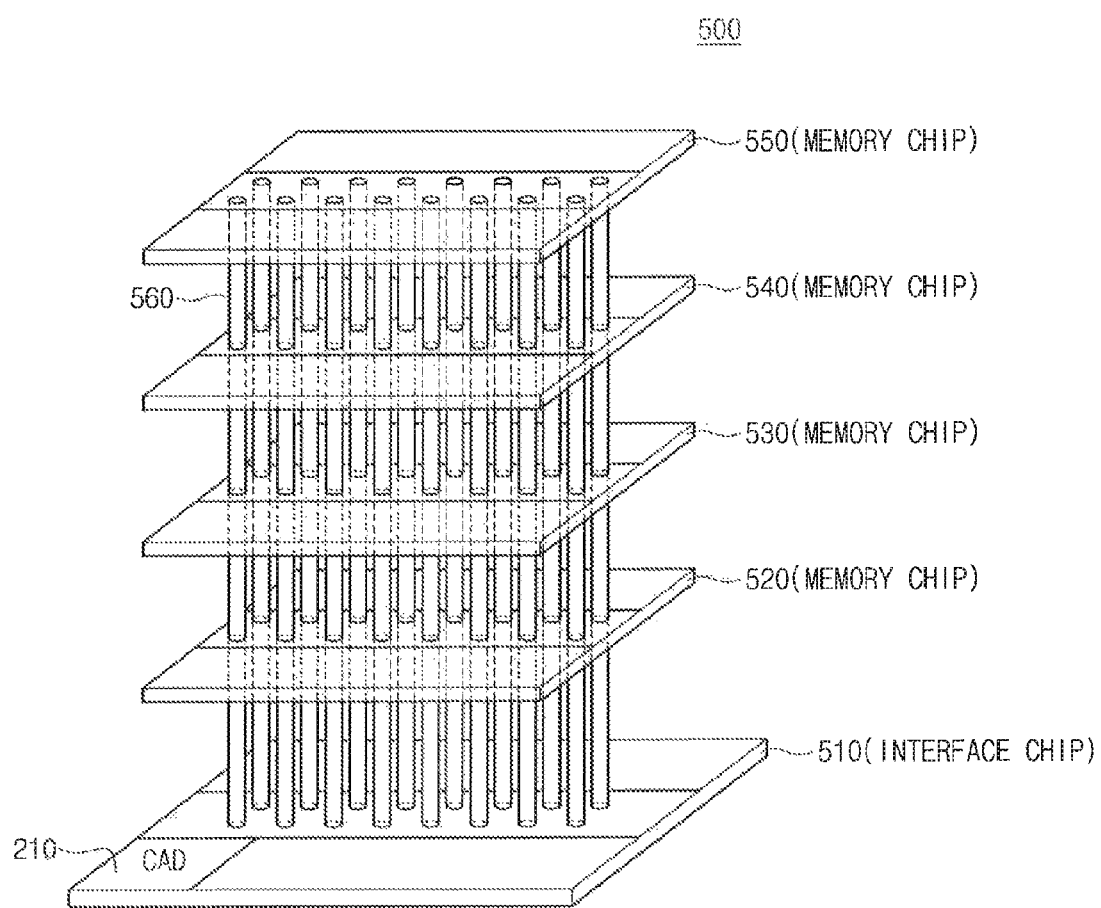
FIG. 12 is a diagram illustrating an exemplary embodiment of the inventive concept applied to a through-silicon via (TSV)

FIG. 12 is a diagram illustrating an exemplary embodiment of the inventive concept applied to a through-silicon via (TSV).

Referring to a stack type memory device 500 in FIG. 12, a plurality of memory chips 520, 530, 540, and 550 is stacked on an interface chip 510 in a vertical direction. Herein, a plurality of TSVs 560 is formed to penetrate the memory chips 520, 530, 540, and 550. Mass data is stored in the three-dimensional stack package type memory device 500 including the memory chips 520, 530, 540, and 550 stacked on the interface chip 510 in a vertical direction. In addition, the three-dimensional stack package type memory device 500 has characteristics such as high speed, low power and scale-down.

In the case of the stack type memory device 500 of FIG. 12, the interface chip 510 includes a concentration access detecting unit 210, so that corruption of data (e.g., DRAM data) in the memory chips 520, 530, 540, and 550 is prevented or alleviated.

The stack type memory device 500 shown in FIG. 12 includes DRAMs according to an exemplary embodiment of the inventive concept. Thus, a DRAM constituting the plurality of memory chips 520, 530, 540, and 550 includes a clock path unit having a delay locked loop circuit like that shown in FIG. 1 or FIG. 6 and a command path unit operating independently from the clock path unit. Therefore, the delay locked loop circuit is powered off during a standby operation or an access operation. Thus, power consumption of the memory device 500 is minimized or reduced. In addition, a jitter-robust and fast update operation is executed by deciding an optimal update period of the delay locked loop circuit.

Figure 13:
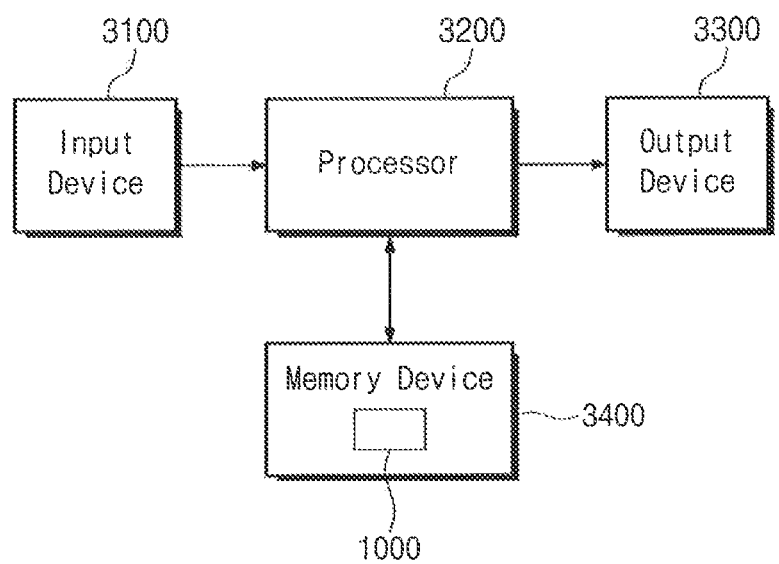
FIG. 13 is a block diagram illustrating an exemplary embodiment of the inventive concept applied to an electronic system.

FIG. 13 is a block diagram illustrating an exemplary embodiment of the inventive concept applied to an electronic system. As illustrated in FIG. 13, an electronic system includes an input device 3100, an output device 3300, a processor 3200, and a memory device 3400. The memory device 3400 includes a DRAM 1000. In addition, note that the DRAM 1000 can be integrated in one of the input device 3100, the output device 3300, and the processor 3200.

In the case of FIG. 13, the DRAM 1000 includes a clock path unit having a delay locked loop circuit like that shown in FIG. 1 and a command path unit operating independently from the clock path unit. Therefore, the delay locked loop circuit is powered off during a standby operation or an access operation. Thus, power consumption of an electronic system is minimized or reduced. In addition, a jitter-robust and fast update operation is executed by deciding an optimal update period of the delay locked loop circuit. Thus, the reliability of the electronic system including the DRAM 1000 is increased and power consumption is reduced.

Figure 14:
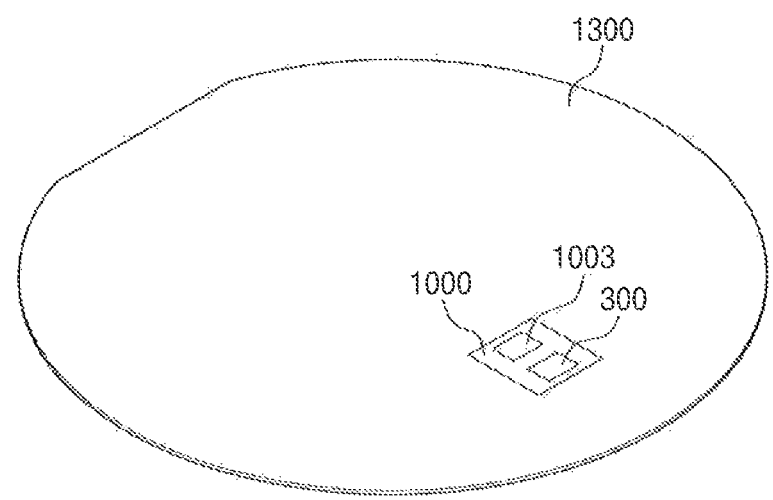
FIG. 14 is a diagram illustrating a semiconductor wafer according to an exemplary embodiment of the inventive concept.

FIG. 14 is a diagram illustrating a semiconductor wafer according to an exemplary embodiment of the inventive concept.

Referring to FIG. 14, a memory device 1000 (e.g., a DRAM) including a delay locked loop circuit 1003 and another circuit component 300 is fabricated on a semiconductor wafer 1300. The memory device 1000 can be fabricated on a variety of semiconductor substrates.

As described above, since the memory device 1000 includes the delay locked loop circuit and a command path unit, the delay locked loop circuit is powered off during a standby operation or an access operation. Thus, power consumption is minimized or reduced. In addition, a jitter-robust and fast update operation is executed by deciding an optimal update period of the delay locked loop circuit.

Figure 15:
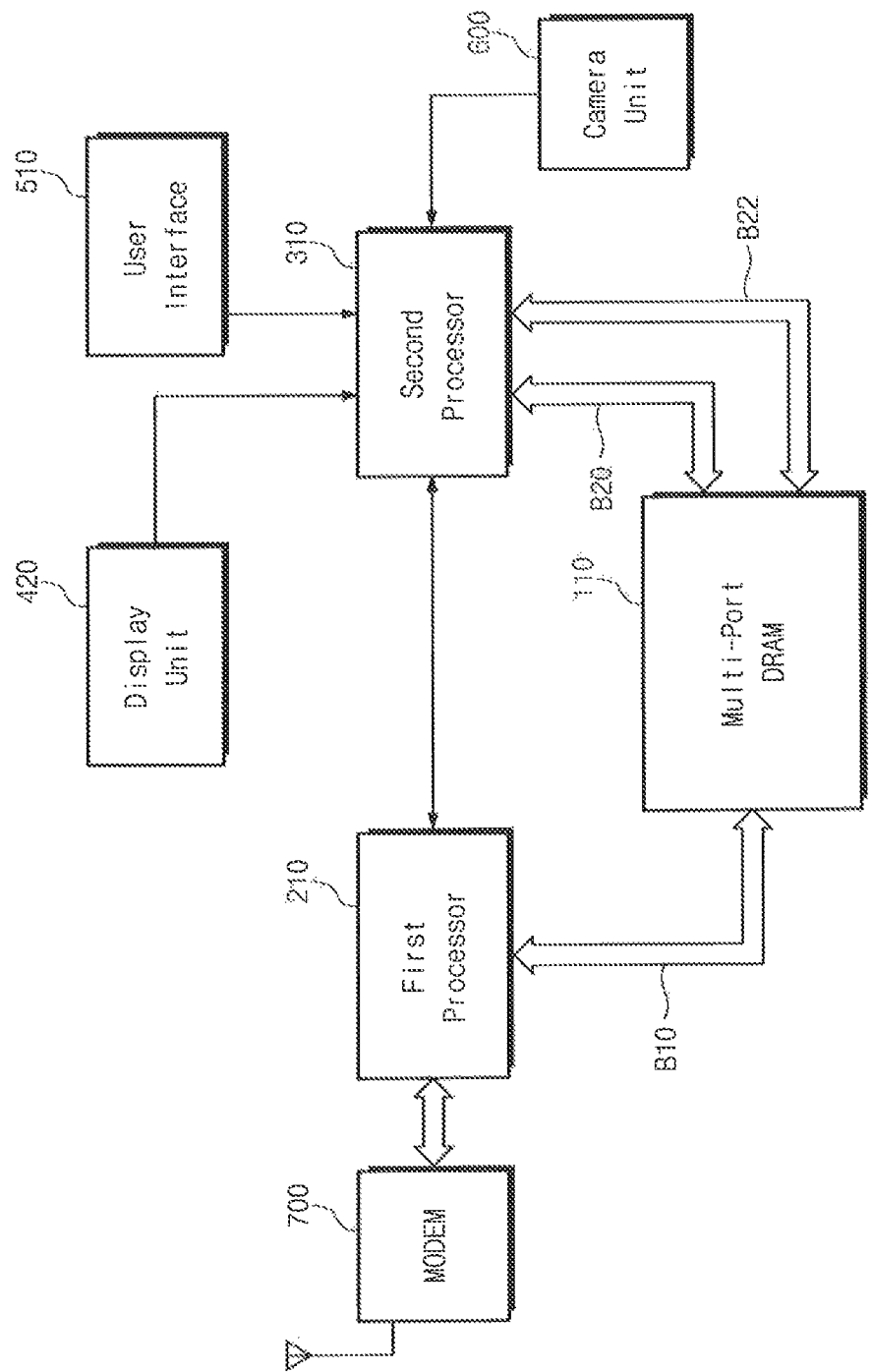
FIG. 15 is a block diagram illustrating an exemplary embodiment of the inventive concept applied to a portable device.

FIG. 15 is a block diagram illustrating an exemplary embodiment of the inventive concept applied to a portable device.

Referring to FIG. 15, a portable device functions as a smart phone and includes a multi-port DRAM 110, a first processor 210, a second processor 310, a display unit 420, a user interface 510, a camera unit 600, and a modem 700.

The multi-port DRAM 110 has three ports respectively connected to first to third buses B10, B20, and B22, and is connected to the first and second processors 210 and 310. The first port of the multi-port DRAM 110 is connected to the first processor 210 (e.g., a baseband processor) through the first bus B10. The second port of the multi-port DRAM 110 is connected to the second processor 310 (e.g., an application processor) through the second bus B20.

In addition, the third port of the multi-port DRAM 110 is connected to the second processor 310 through the third bus B22.

Thus, the multi-port DRAM 110 may replace one storage memory and two DRAMs. The multi-port DRAM 110 can be implemented by a semiconductor memory device configured as illustrated in FIG. 1.

The multi-port DRAM 110 of FIG. 15 includes three ports to perform roles of a DRAM and a flash memory. In this case, the multi-port DRAM 110 operates as a DRAM interface, so that it replaces two DRAMs.

The multi-port DRAM 110 has an operation range and an operation voltage that SDRAM DDR4 requires.

The multi-port DRAM 110 includes a delay locked loop circuit and a command path unit, so that the delay locked loop circuit is powered off during a standby operation or an access operation. Thus, power consumption is minimized or reduced.

An interface of the first bus B10 may be a volatile memory interface, and the first port of the multi-port DRAM 110 may receive first packet data generated from the first processor 210 to transfer it to an internal circuit block of the multi-port DRAM 110. In addition, the first port of the mufti-port DRAM 110 may provide first data of the multi-port DRAM 110 to the first processor 210. In this case, the first data may be parallel data.

An interface of the third bus B22 may be a volatile memory interface, and the third port of the multi-port DRAM 110 may receive third packet data generated from the second processor 310 to transfer it to an internal circuit block of the multi-port DRAM 110. In addition, the third port of the multi-port DRAM 110 may provide third data of the multi-port DRAM 110 to the second processor 310.

An interface of the second bus B20 may be a nonvolatile memory (e.g., a NAND flash) interface, and the second port of the multi-port DRAM 110 may receive second packet data generated from the second processor 310 to transfer it to an internal circuit block of the multi-port DRAM 110. In addition, the second port of the multi-port DRAM 110 may provide second data of the multi-port DRAM 110 to the second processor 310. In this case, the second data may be serial data or parallel data.

An interface of the buses B10, B20 and B22 may implement an interface protocol such as Universal Serial Bus (USB), Multi-Media Card (MMC), Peripheral Component Interconnect-Express (PCIE), Serial-attached SCSI (SAS), Serial Advanced Technology Attachment (SATA), Parallel Advanced Technology Attachment (PATA), Small Computer System Interface (SCSI), Enhanced Small Disk Interface (ESDI), and Integrated Drive Electronics (IDE).

In some cases, the first and second processors 210 and 310 and the DRAM 110 may be integrated to a chip or packaged. In the case of FIG. 15, the DRAM 110 may be embedded in the portable device.

In the event that the portable device is a smart phone, the first processor 210 is connected to the modem 700 that transmits and receives communications data and modulates and demodulates data.

A NOR or NAND flash memory may be additionally connected to the first processor 210 or the second processor 310 to store mass information.

The display unit 420 may have a liquid crystal having a backlight, a liquid crystal having an LED light source, or a touch screen (e.g., OLED). The display unit 420 may be an output device for displaying images (e.g., characters, numbers, pictures, etc.) in color.

There is described an example in which the portable device is a smart phone. In some cases, the portable device may be used as a smart card by adding or removing components.

The portable device may be connected to an external communications device through a separate interface. The communications device may be a DVD player, a computer, an STB, a game machine, a digital camcorder, or the like.

The camera unit 600 may include a camera image processor (CIS), and may be connected to the second processor 310.

Although not shown in FIG. 15, the portable device may further include an application chipset, a CIS, a mobile DRAM, and so on.

In FIG. 15, there is illustrated an example in which a DRAM is installed at the portable device. However, a variety of nonvolatile memories may be used instead of the DRAM.

The nonvolatile memory may store various types of data information such as texts, graphics, software codes, etc.

While the inventive concept has been described with reference to exemplary embodiments thereof, it will be understood by one of ordinary skill in the art that various changes and modifications may be made therein without departing from the spirit and scope of the inventive concept as defined by the claims. Therefore, it should be understood that the above embodiments are not limiting, but illustrative. For example, various changes and modifications to the circuit configuration or arrangement of a clock path unit including a delay locked loop circuit and a clock path unit operating independently from the clock path unit may be made without departing from the spirit and scope of the present inventive concept. In addition, the inventive concept is described using a DRAM including DRAM memory cells. However, the inventive concept is applicable to another semiconductor memory device such as an MRAM having a delay locked loop circuit.

What is claimed is:

1. An operation control method of a semiconductor memory device, comprising:
    executing a Delay Locked Loop (DLL) locking in response to a DLL reset signal;
    measuring a loop delay of a DLL;
    storing measured loop delay information and DLL locking information; and
    performing a delay control of a command path using the stored loop delay information and DLL locking information during a latency control operation, wherein the delay control is performed while the DLL is inactive,
    wherein the loop delay information is used to determine an additive delay of an additive delay line included in the command path,
    wherein the loop delay is measured by counting a feedback clock applied to a phase detector of the DLL within an interval.

2. The operation control method of claim 1, wherein the DLL comprises a clock path, wherein the command path and the clock path are driven independently from each other.

3. The operation control method of claim 1, wherein the DLL locking information is used to determine a DLL delay of a delay line replica that is connected to an output of the additive delay line and wherein the delay line replica has the same delay as that of a delay line of the DLL.

4. The operation control method of claim 1, wherein a latency value applied through the command path is used to determine the additive delay.

5. The operation control method of claim 1, wherein a number of rising edges of the feedback clock are counted.

6. A semiconductor memory device, comprising:
    a Delay Locked Loop (DLL) configured to execute a DLL locking at a DLL reset;
    a DLL control part configured to control the DLL and store DLL locking information at the DLL locking;
    a loop delay measure circuit configured to measure and store a loop delay of the DLL; and
    a command path unit including an additive delay line configured to determine an additive delay in response to the stored loop delay, and a delay line replica having the same delay as that of a delay line of the DLL and configured to determine a DLL line delay in response to the DLL locking information,
    wherein during a latency control operation, a delay control of the command path unit is performed using the stored loop delay and DLL locking information,
    wherein the delay control is performed while the DLL is inactive,
    wherein the DLL comprises:
    a DLL delay line configured to delay an input clock according to a delay selection signal;
    a data output buffer replica having the same delay as a delay of a data output buffer and configured to receive an output clock of the DLL delay line;
    a clock buffer replica having the same delay as a delay of a clock buffer and configured to receive an output buffer clock from the data output buffer replica; and
    a phase detector configured to generate a phase error detection signal by comparing the input clock with a feedback clock from the clock buffer replica.

7. The semiconductor memory device of claim 6, wherein the DLL control part controls the DLL in response to the phase error detection signal and latches the delay selection signal as the DLL locking information at the DLL locking.

8. The semiconductor memory device of claim 6, wherein the loop delay measure circuit measures the loop delay of the DLL by counting a result obtained by comparing the feedback clock and the input clock within an interval.

9. The semiconductor memory device of claim 6, wherein the loop delay measure circuit comprises:
- a counting circuit configured to count a result obtained by comparing the feedback clock and the input clock within an interval;
- a decoder configured to decode the count result; and
- an adder configured to generate the additive delay information using a decoding output value of the decoder and a latency value.

10. The semiconductor memory device of claim 9, wherein the command path unit further comprises:
- a command buffer; and
- a command decoder connected between the command buffer and the additive delay line.

* * * * *